United States Patent
Sun et al.

(10) Patent No.: US 7,532,822 B2
(45) Date of Patent: May 12, 2009

(54) CLOCK RECOVERY FROM AN OPTICAL SIGNAL WITH POLARIZATION IMPAIRMENTS

(75) Inventors: Han Sun, Nepean (CA); Slobodan Jovanovic, Bethesda, MD (US); Kuang Tsan Wu, Kanata (CA); Chandra Bontu, Nepean (CA); Kim B Roberts, Nepean (CA); Jianzhong Xu, Gaithersburg, MD (US)

(73) Assignee: Nortel Networks Limited, St. Laurent, Quebec (CA)

( * ) Notice: Subject to any disclaimer, the term of this patent is extended or adjusted under 35 U.S.C. 154(b) by 502 days.

(21) Appl. No.: 11/315,345

(22) Filed: Dec. 23, 2005

(65) Prior Publication Data

US 2006/0285855 A1   Dec. 21, 2006

Related U.S. Application Data

(60) Provisional application No. 60/728,751, filed on Oct. 21, 2005, provisional application No. 60/656,368, filed on Feb. 28, 2005.

(51) Int. Cl.
 *H04B 10/00* (2006.01)
(52) U.S. Cl. .................. 398/155; 398/152; 398/159
(58) Field of Classification Search ............... 398/155, 398/152, 154, 147, 159, 158; 359/337.5, 359/338, 498, 499, 483
See application file for complete search history.

(56) References Cited

U.S. PATENT DOCUMENTS 4,506,388 A    3/1985    Monerie et al.
4,720,827 A    1/1988    Kanaji
4,723,316 A    2/1988    Glance
4,965,858 A    10/1990   Naito et al.
5,457,563 A    10/1995   Van Deventer
5,473,463 A    12/1995   Van Deventer
5,995,512 A    11/1999   Pogue et al.
6,091,704 A *  7/2000    Butash ................... 370/210

(Continued)

FOREIGN PATENT DOCUMENTS

EP    1453239 A1    9/2004

(Continued)

OTHER PUBLICATIONS

S. Calabro, T. Dullweber, E. Gottwald, N. Hecker-Denschlag, E. Mullner, B. Opitz, G. Sebald, E. D. Schmidt, B Spihnler, C.-J. Weiske, H. Zech; "An electrical polarization-state controller and demultiplexer for polarization multiplexed optical signals"; Sep. 2000; 2 Pages; Siemens AG, Optical Solutions ICN CP D NT OS, Hofmannstrasse 51, D-83439 Munich Germany.

(Continued)

*Primary Examiner*—M. R. Sedighian
(74) *Attorney, Agent, or Firm*—Pearne & Gordon LLP

(57) ABSTRACT

A method of recovering a clock signal from an optical signal received through an optical communications system. A digital sample stream is processed to generate a dispersion compensated signal. The dispersion compensated signal is then tapped to obtain upper side band and lower side band signals of each received polarization of the optical signal. The upper side band sand lower side band signals are then processed to compensate polarization dependent impairments and the clock recovered from the resulting optimized.

68 Claims, 9 Drawing Sheets

U.S. PATENT DOCUMENTS

| | | | |
|---|---|---|---|
| 6,473,222 | B2 | 10/2002 | Hait et al. |
| 6,607,311 | B1 | 8/2003 | Fishman et al. |
| 6,782,211 | B1 | 8/2004 | Core |
| 7,158,727 | B2 * | 1/2007 | Pathak et al. ............... 398/155 |
| 7,224,911 | B2 * | 5/2007 | Dai et al. ................... 398/209 |
| 2002/0012152 | A1 | 1/2002 | Agazzi et al. |
| 2002/0186435 | A1 * | 12/2002 | Shpantzer et al. .......... 359/136 |
| 2003/0063285 | A1 | 4/2003 | Pering et al. |
| 2003/0123884 | A1 | 7/2003 | Willner et al. |
| 2003/0175034 | A1 | 9/2003 | Noe |
| 2004/0114939 | A1 | 6/2004 | Taylor |
| 2005/0196176 | A1 | 9/2005 | Sun et al. |
| 2006/0013597 | A1 * | 1/2006 | Crivelli et al. ............. 398/208 |

FOREIGN PATENT DOCUMENTS

| | | | |
|---|---|---|---|
| GB | 2214381 | A | 8/1989 |
| WO | WO 00/60776 | | 10/2000 |
| WO | WO 02/27994 | A1 | 4/2002 |

OTHER PUBLICATIONS

Reinhold Noé; "Phase Noise-Tolerant Synchronous QPSK/BPSK Baseband-Type Intradyne Receiver Concept With Feedforward Carrier Recovery"; Journal of Lightwave Technology, vol. 23, No. 2, Feb. 2005; pp. 802-808.

R. Noé; "PLL-Free Synchronous QPSK Polarization Multiplex/Diversity Receiver Concept With Digital I&Q Baseband Processing"; IEEE Photonics Technology Letters, vol. 17, No. 4, Apr. 2005; pp. 887-889.

Richard A. Linke, et al., "High-Capacity Coherent Lightwave Systems", Journal of Lightwave Technology, vol. 6, No. 11, Nov. 1988.

Chul-Ho Shin, et al., "Heterodyne Optical Phase-Locked Loop by Confocal Fabry-Perot Cavity Coupled AlGaAs Lasers", IEEE Photonoics Technology Letters, vol. 2, No. 4, Apr. 1990, pp. 297-300.

D.-S. Ly-Gagnon, et al., "Coherent Detection of Optical Quadrature Phase-Shift Keying Signals with Carrier Phase Estimation", Journal of Lightwave Technology, vol. 24, No. 1, Jan. 2006, pp. 12-21.

Frowin Derr, "Coherent Optical QPSK Intradyne System: Concept and Digital Receiver Realization", Journal of Lightwave Technology, vol. 10, No. 9, Sep. 1992, pp. 1290-1296.

D.-S. Ly-Gagnon, et al., "Unrepeatered optical transmission of 20 Gbit/s quadrature phase-shift keying signals over 210 km using homodyne phase-diversity receiver and digital signal processing", Electronics Letters, vol. 41, No. 4, Feb. 17, 2005, pp. 1-2.

Y. Cia, et al., "On Performance of Coherent Phase-Shift-Keying Modulation in 40 Gb/s Long-Haul Optical Fiber Transmission Systems", OFC, Mar. 2006, pp. 1-3.

Matthias Seimetz, "Performance of Coherent Optical Square-16-QAM-Systems based on IQ-Transmitters and Homodyne Receivers with Digital Phase Estimation", OFC, Mar. 2006, pp. 1-10.

U. Koc, et al., Digital Coherent Quadrature Phase-Shift-Keying (QPSK), OFC, Mar. 2006, pp. 1-3.

Satoshi Tsukamoto, et al., "Coherent Demodulation of Optical 8-Phase Shift-Keying Signals Using Homodyne Detection and Digital Signal Processing", OFC, Mar. 2006, pp. 1-3.

Kazuro Kikuchi, "Coherent Detection of Phase-Shift Keying Signals Using Digital Carrier-Phase Estimation", OFC, Mar. 2006, pp. 1-3.

B. Spinnler, "Chromatic Dispersion Tolerance of Coherent Optical Communications Systems With Electrical Equalization", OFC, Mar. 2006, pp. 1-3.

R.I. Killey, et al., "Electronic dispersion compensation by signal predistortion", OFC, Mar. 2006, pp. 1-3.

Satoshi Tsukamoto, et al., "Unrepeated 20-Gbit/s QPSK Transmission over 200-km Standard Single-Mode Fiber Using Homodyne Detection and Digital Signal Processing for Dispersion Compensation", OFC, Mar. 2006, pp. 1-3.

Ezra Ip, et al., "Carrier Synchronization for 3-and 4-bit-per-Symbol Optical Transmission", Journal of Lightwave Technology, vol. 23, No. 12, Dec. 2005, pp. 4110-4124.

Yan Han, et al., "Coherent optical communication using polarization multiple-input-multiple-output", Optics Express, vol. 13, No. 19, Sep. 19, 2005, pp. 7527-7534.

L.E. Franks, "Carrier and Bit Synchronization in Data Communication—A Tutorial Review", IEEE Transactions on Communications, vol. COM-28, No. 8, Aug. 1980, pp. 1107-1121.

M. Cavallari, et al., "Electronic Signal Processing for Differential Phase Modulation Formats", OFC 2004, pp. 1-3.

A. Farbert, et al., "Performance of a 10.7 Gb/s Receiver with Digital Equaliser using Maximum Likelihood Sequence Estimation", ECOC 2004, Proceedings PD-Th4.1.5, Stockholm, pp. 1-2.

Yusuke Ota, et al., "High-Speed, Burst-Mode, Packet-Capable Optical Receiver and Instantaneous Clock Recovery for Optical Bus Operation", Journal of Lightwave Technology, vol. 12, No. 2, Feb. 1994, pp. 325-331.

Isaac Shpantzer, Ph.D., "A New Generation of Coherent ULH Fiber-Optic Communication", CeLight Inc., 40 G Workshop, OECC-2002 Conference, Yokohama, Japan, Jul. 8, 2002, pp. 1-14.

Isaac Shpantzer, Ph.D. et al., "Coherent Optical Fiber Communication Architecture, Modeling and Optimization", CeLight Inc., SCEE 2002 Conference, Eindhoven, The Netherlands, Jun. 25, 2002, pp. 1-39.

M. Tseytlin et al., "Digital, endless polarization control for polarization multiplexed fiber-optic communications", CeLight Inc., OFC 2003, Mar. 24, 2003, pp. 1-14.

International Search Report for applicant's related International PCT Application PCT/CA2006/001458, Sep. 5, 2006.

International Search Report for applicant's related International PCT Application PCT/CA2006/001460, Sep. 5, 2006.

* cited by examiner

CLOCK RECOVERY FROM AN OPTICAL SIGNAL WITH POLARIZATION IMPAIRMENTS

CROSS-REFERENCE TO RELATED APPLICATIONS

This application claims benefit under 35 U.S.C. 119(e) from U.S. Provisional Patent Application Ser. No. 60/656,368 entitled: Optical Signal Transmitter System with Electronic Precompensation, which was filed on Feb. 28, 2005 and U.S. Provisional Patent Application Ser. No. 60/728,751, entitled: Automatic Gain Control, which was filed on Oct. 21, 2005.

MICROFICHE APPENDIX

Not Applicable.

TECHNICAL FIELD

The present invention relates to optical communications networks, and in particular to a method and apparatus for recovering a clock signal from optical signals received through an optical communications network.

BACKGROUND OF THE INVENTION

In the optical communications space, techniques used to detect data modulated onto an optical communications signal may be broadly group into two classes, namely "direct" detection and "coherent" detection. In "direct" detection techniques, the optical signal is made incident on a photodetector. The electrical current appearing at the photodetector output is proportional to the square of the optical E-field. Data modulated onto the optical signal using an amplitude-modulation scheme, such as On-Off Keying (OOK) can thus be detected by analysis of the photodetector output current. Direct detection techniques have advantages in terms of low cost, and high reliability for On-Off Keying (OOK) based modulation schemes. As a result, the majority of optical receivers currently used in optical communications networks are based on direct detection.

In "coherent" detection techniques, the optical signal is mixed with a strong, narrow-line-width, local oscillator signal by an optical hybrid, and the combined signal made incident on one or more photodetectors. In some systems, the inbound optical signal is first split into orthogonal polarizations, and each polarization processed by a respective optical hybrid. In-phase and Quadrature components of each polarization can be detected using respective photodetectors positioned to receive corresponding signals output by the optical hybrid. The frequency spectrum of the electrical current appearing at the photodetector output(s) is substantially proportional to the convolution of the spectrum of the received optical signal and the local oscillator, and contains a signal component lying at an intermediate frequency that contains the data. Consequently, this "data component" can be isolated and detected by electronically filtering and processing the photodetector output current.

Coherent detection receivers offer numerous advantage over direct detection receivers, many of which follow from the fact that coherent detection techniques provide both phase and amplitude information of the optical signal. As such, more robust modulation schemes, such as phase shift keying (PSK), differential phase shift keying (DPSK) and quadrature phase shift keying (QPSK) can be used.

As is well known in the art, accurate recovery of a Clock signal from the received optical signal is essential for all digital signal processing techniques, and is fundamental in all digital signal receiver systems. Typically, the clock signal is recovered from the photodetector output current. For example, quadrature coherent receivers are described by R Noé, in: "*Phase Noise-Tolerant Synchronous QPSK/BPSK Baseband-Type Intradyne Receiver Concept With Feedforward Carrier Recovery*", Journal of Lightwave Technology, Vol. 23, No. 2, February 2005, and "*PLL-Free Synchronous QPSK Polarization Multiplex/Diversity Receiver Concept with Digital I&Q Baseband Processing*", IEEE Photonics Technology Letters, Vol. 17, No. 4, April 2005; and by Y. Han et al. in "*Coherent optical Communication Using Polarization Multiple-Input-Multiple-Output*", OPTICS EXPRESS Vol. 13, No. 19, pp 7527-7534, 19 Sep. 2005.

FIG. 1a schematically illustrates the system of Noé (Supra, April 2005). As may be seen in FIG. 1, an optical signal received through an optical link 2 is divided by a polarization beam splitter 4 into orthogonal polarizations (nominally referred to as X and Y polarizations in FIG. 1), which are then mixed with a local oscillator (LO) 6 through a quadrature 90° optical hybrid 8. The composite optical signals appearing at the output of the optical hybrid 8 are made incident on a set of photodetectors 10 to generate analog electrical signals respectively corresponding to real (Re) and imaginary (Im) parts of each polarization. These analog signals are then sampled at the symbol rate by respective Analog-to-Digital (A/D) converters 12 to generate digital sample streams of each of the real (Re) and imaginary (Im) parts of each polarization. The digital samples are then supplied to a 1:M DEMUXer 14, which splits the data path into M parallel sample streams having a lower sample rate (by a factor of M), each of which is supplied to a respective processing module 16. Within each processing module 16, an inverse Jones matrix that models the polarization performance of the optical link is used to compensate polarization distortions. The polarization compensated samples can then be decoded for data recovery.

In the system of Noé (April 2005), clock recovery is performed using either: a clock recovery block 18 inserted into the data path between the photodetectors and the A/D converters (FIG. 1a), or alternatively using an intensity modulation direct detection receiver 20 as shown in FIG. 1b. Recovering the clock signals from the electrical I and Q signals generated by the photodetectors, as shown in FIG. 1a, is beneficial in that it keeps all of the received optical power within the main data path, and at the same time makes both amplitude and phase information of the received optical signal available to the clock recovery circuit. However, this solution renders the system extremely sensitive to polarization impairments. The use of a direct detection receiver 20 for clock recovery, as shown in FIG. 1b, avoids problems associated with the polarization sensitivity of the coherent receiver. However, this solution diverts at least a portion of the energy of the received optical signal out of the data path, and is vulnerable to severe chromatic dispersion and polarization impairments at least in part due to inter-symbol interference (ISI).

For example, consider a scenario in which first order PMD on the optical link has a magnitude equal to one half of a symbol period. In this case, the received optical signal contains a mixture of two versions of the transmitted data signals, separated by a half symbol differential delay. Interference between the two versions can prevent the clock recovery circuit from successfully achieving a phase/frequency locked state. Indeed, in this example, when the signal power is equally split between the two modes of the PMD, the recovered clock tone goes to zero. In real-world networks, the amount of power in each mode varies with time. Each time the amount of power in one mode becomes greater than that of the other mode, the phase of the recovered clock jumps by 180 degrees.

The polarization impairments are generally time varying, with speeds as high as tens of kilohertz. This means that the phase of the recovered clock can be moved about by the polarization impairments. A clock recovery that was locked can lose lock. This does not provide a reliable communication link.

The above noted problems, in respect of both systems, are compounded for polarization-division multiplexed signals, in which each transmitted polarization contains a respective different data signal. Neither of the techniques suggested by Noé offers a robust solution for clock recovery from highly distorted optical signals of the type encountered in "real-world" optical communications networks.

Accordingly, techniques enabling clock recovery from a received optical signal, in the presence of severe distortions, remains highly desirable.

SUMMARY OF THE INVENTION

Accordingly, an object of the present invention is to provide methods enabling clock recovery from a highly distorted optical signal.

Thus, an aspect of the present invention provides a method of recovering a clock signal from a high speed optical signal received through an optical communications network. A stream of multi-bit digital samples of the optical signal is processed to generate a dispersion compensated signal. The dispersion compensated signal is then processed to generate an optimized signal; and a clock phase of the optimized signal is then detected.

Another aspect of the present invention provides method of recovering a clock signal from a high speed polarization multiplexed optical signal received through an optical communications network. A clock recovery circuit is provided which includes an optimization block implementing an inverse Jones matrix for processing a multi-bit digital signal corresponding to the optical signal; and an adaptation loop for computing updated coefficients of the inverse Jones matrix. In a locked state off the clock recovery circuit, the adaptation loop is controlled to compute updated coefficients of the inverse Jones matrix based on parameters of the optical signal. On the other hand, in an unlocked state of the clock recovery circuit, the adaptation loop is made to sweep the coefficients of the inverse Jones matrix at a predetermined rate.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION OF THE PREFERRED EMBODIMENT

Figure 1A:
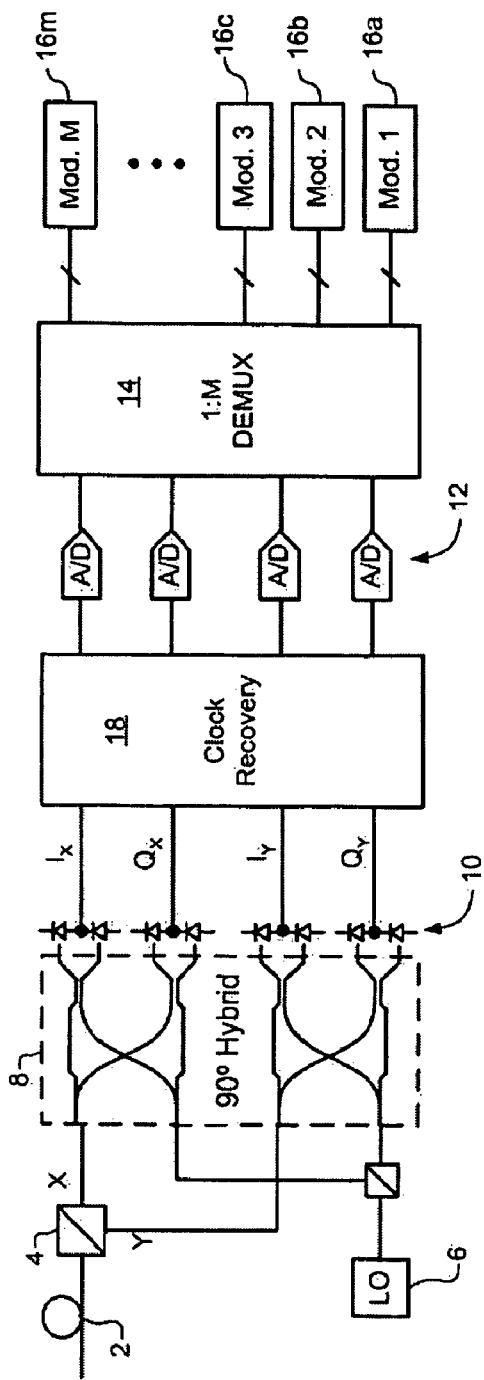
FIGS. 1A and 1B are block diagrams schematically illustrating clock recovery methods for use in conjunction with coherent optical receivers known in the prior art.
Figure 1B:
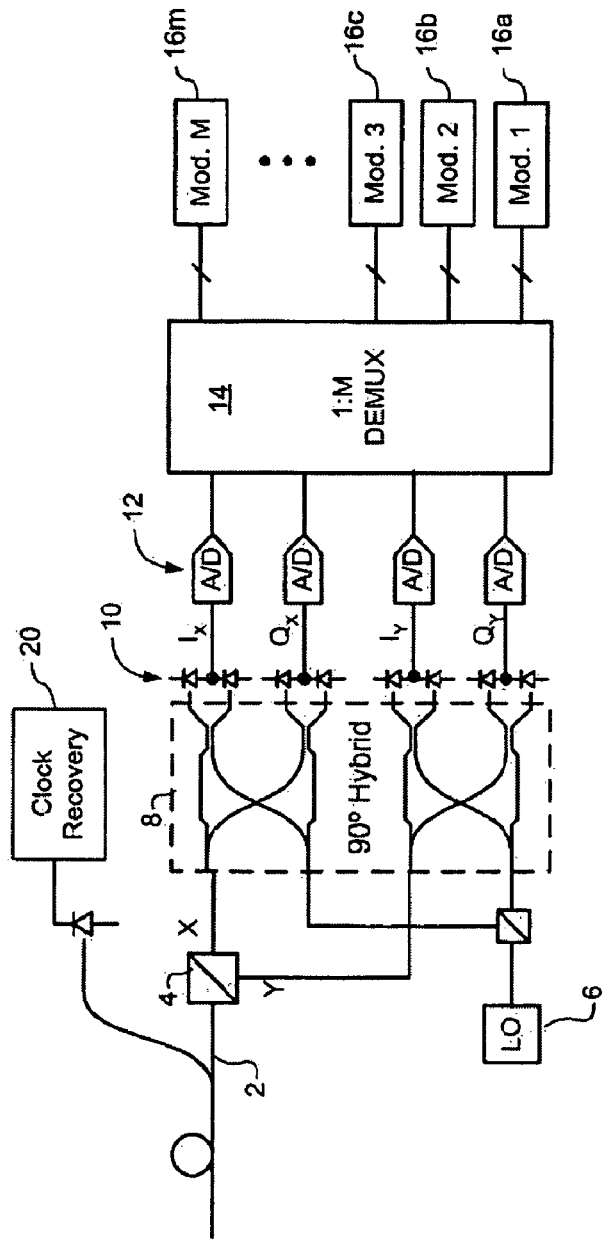

The present invention provides methods and systems enabling clock recovery from a highly distorted optical signal. Embodiments of the invention are described below, by way of example only, with reference to FIGS. 2-8.

In general, the present invention provides a clock recovery circuit in which a multi-bit sample stream of a received optical signal is digitally processed to compensate dispersion and/or polarization, an a clock signal recovered from the resulting compensated signal. It should be noted that in all cases the methods presented herein are "real-time", in that the clock is recovered during reception of the optical signal, so that the recovered clock can be used to control the optical receiver, for example. This contrasts with typical laboratory bench-top systems, in which samples of an optical signal are stored for later processing, for example using an oscilloscope, to extract clock information.

Various methods may be used to recover a clock from a compensated signal. For example, in an optical receiver having electronic dispersion compensation, as in Noé (Supra) for example, a nominal clock having a frequency that is sufficiently close to the optical signal symbol rate the could be used to enable the receiver to acquire the optical signal. Oversampling the optical signal (e.g. at 3× or 4× the symbol rate) can increase the frequency error tolerance. Once the optical signal has been acquired by the receiver, the distortion compensated signals generated by the receiver's data path can be used for clock recovery in "steady-state" operation of the receiver.

Another approach is to synthesize the clock signal by processing (e.g. by filtering, mixing etc) the digital signal without the use of a phase locked loop, and indeed without the use of an oscillator. The derived clock need not be used to control the sampling, and need not be a periodic electrical signal. In fact, it may only exist as the phase of a mathematical interpolation function applied to a sequence of sets of digital values.

Still another approach is to select one sampling phase for clock recovery, and then monitor the mean power at the selected phase. The initial selection of the sampling phase may be based on the mean power level, for example by selecting the sampling phase having the highest mean power level. Following the initial selection. If the mean power at the current sampling phase is less than the mean power at 180 degrees away, then the sign of the PLL feedback can be toggled so that the PLL will now track the sampling phase having a maximum mean power. The mean power levels at each phase can be estimated directly from a portion of the samples. This arrangement reduces the sensitivity of the clock-recovery circuit to changes in the optical signal due to polarization effects.

Thresholds, limiting functions, arctan functions, and other linear or nonlinear functions can be applied to the sample stream to augment or generate a clock component. Different polarization conditions cause different functions to have the best utility. One can select between a set of these functions in response to changing polarization conditions, or changing clock quality, to maintain adequate utility and therefore adequate clock quality.

While the above approaches can be expected to work under at least some conditions, it is difficult to prove that they will work over a sufficiently wide range of conditions that are expected to be encountered in a real-world network, and this challenge increases with increasing dispersion and polarization distortion of the optical signal.

Figure 2:
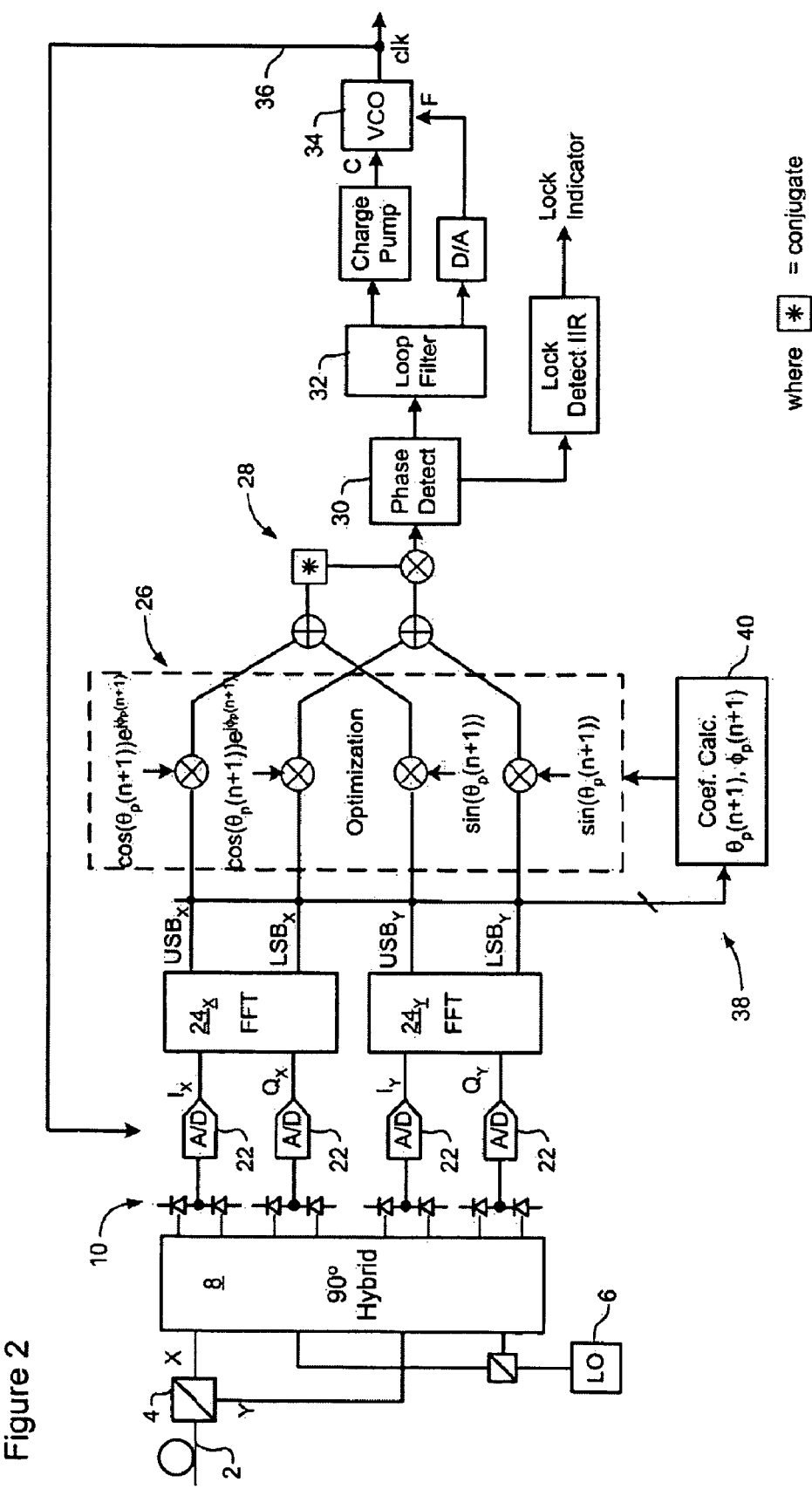
FIG. 2 is a block diagram schematically illustrating representative operations of a clock recovery circuit in accordance with an embodiment of the present invention.

FIG. 2 illustrates a clock recovery circuit in accordance with an embodiment of the present invention which overcomes these difficulties. In the embodiment of FIG. 2, an inbound optical signal is received through an optical link 2, split into orthogonal polarizations by a Polarization Beam Splitter 4, and then mixed with a Local Oscillator (LO) 6 signal by a conventional 90° optical hybrid 8. The composite optical signals emerging from the optical hybrid are supplied to respective photodetectors 10, which generate corresponding analog signals. The photodetector signals are sampled by respective Analog-to-Digital (A/D) converters 22 to yield sample streams corresponding to In-phase (I) and Quadrature (Q) components of each of the received polarizations. The multi-bit I and Q sample streams generated by the A/D converters 34 are supplied to Fast Fourier Transform (FFT) filters 24, which analyse the spectral content of each polarization and apply a first order dispersive function which compensates the expected chromatic dispersion of the link 2. At the output of the FFT filters 24, respective Upper Side Band (USB) and Lower side Band (LSB) signals of each polarization are tapped and supplied to an optimization block 26, which implements a simplified polarization compensation function. The compensated USB and LSB signals appearing at the output of the optimization block 48 are then combined at 28), and the resulting signal supplied to a clock phase detector 30. The phase detection result is then passed to a loop filter 32, which supplies respective control signals to coarse (C) and fine (F) tuning ports of a voltage controlled Oscillator (VCO) 34. The VCO output 36 is used as the A/D sample clock for driving the A/D converters 22. The signal path from the A/D converters 22, through the FFT filters 24, the optimization block 26, phase detector 30, loop filter 32, VCO 34 and back to the A/D converters 22 defines a Phase Locked Loop (PLL) which tunes the VCO output 36 to phase and frequency match symbols modulated onto the received optical signal. The VCO output 36 can also be supplied to a Digital Signal processor (DSP) (not shown in FIG. 2) for controlling operation of the clock recovery circuit.

As may be seen in FIG. 2, the FFT filters 24, optimization block 26, phase detector 30 and loop filter 32 are cascaded together to form a high speed data path. Pipelining the signal processing and clock recovery functions in this manner minimises the response time of the PLL, and thereby facilitates effective "real-time" clock recovery.

As may be appreciated, the resolution of the A/D converters 22 is a balance between performance and cost. Increasing the resolution improves sampling accuracy, and thereby improves the extent to which signal distortions can be corrected by downstream dispersion sand polarization compensators. However, this increased accuracy is obtained at a cost of increased complexity, silicon area and heat generation. It has been found that a resolution of 5 or 6 bits provides satisfactory performance, at an acceptable cost. Preferably, the sample rate of the A/D converters 22 is selected to satisfy the Nyquist criterion, for the highest anticipated symbol rate of the received optical signal. As will be appreciated, Nyquist sampling ensures that the sample streams generated at the A/D converter output contains all of the information content of each signal, even if the sample timing (with reference to each received symbol) is ambiguous and/or unknown.

The FFT filters 24 operate in a known manner to compute the spectrum of each received polarization, and apply a first order dispersive function which at least partially compensates chromatic dispersion. As will be appreciated, the amount of dispersion that can be compensated will be a function of the width of the FFT filters 24, which will be a balance between performance and cost. In some embodiments, each FFT filter 24 has a width of 256 samples, which enables compensation of well over 10000 ps/nm of dispersion.

As will be appreciated, tapping the USB and LSB signals from the FFT output is a simple matter of tapping the appropriate points. For example, in some embodiments, the upper and lower side band signals are obtained by tapping 16 points for each signal, respectively centered at ±half the symbol rate.

Tapping the upper and Lower side band signals at the output of the FFT filters 24, after substantial chromatic dispersion compensation has been applied has the effect of rendering he clock detectable, ever in the presence of severe dispersion impairments in the received optical signal. For example, in some embodiments, a clock can be accurately detected from a 10 Gigasymbol per second signal distorted by dispersion in excess of 50000 ps/nm. This is ten or twenty times the dispersion that can be tolerated by conventional clock recovery circuits operating on that signal.

In the embodiment of FIG. 2, the Upper and Lower side band signals appearing at the output of the FFT filters 24 are supplied to an adaptation loop 38 having a coefficient calculator 40 which determines filter coefficients that will compensate polarization impairments of the received optical signal.

Figure 3:
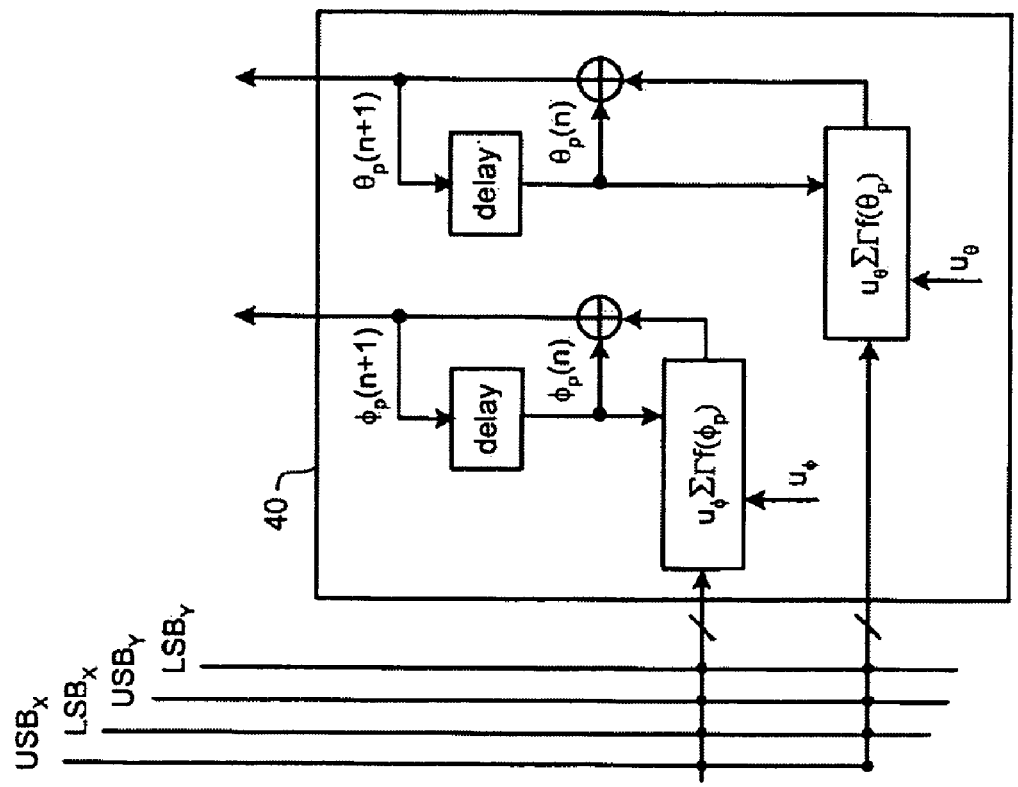
FIG. 3 is a block diagram schematically illustrating representative operations of the adaptation loop of the embodiment of FIG. 2.

As mentioned above, the optimization block 26 preferably implements a simplified polarization compensation function, which partially compensates polarization impairments of the received optical signal. As will be appreciated, there are a variety of methods that can be used to compensate polarization impairments. One method is to use the inverse of a Jones matrix which models the polarization behaviour of the optical link 2. In the embodiment of FIG. 2, the optimization block 26 implements an inverse Jones matrix using angle $\theta(n+1)$ and phase $\phi(n+1)$ filter coefficients generated by the coefficient calculator 40. These filter coefficients are iteratively recalculated to optimize a lock detection function $f(\theta_p, \phi_p)$ value generated by the phase detector 30 (described in greater detail below). FIG. 3 illustrates one method by which the filter coefficients $\theta(n+1)$ and $\phi(n+1)$ may be generated.

In the embodiment of FIG. 3, the coefficient calculator 40 implements parallel feed-back optimization loops which respectively update the phase $\phi_p$ and angle $\theta_p$ coefficients in accordance with a pair of update equations:

$$\phi_p(n+1) = \phi_p(n) + u_\phi \sum_{k=1}^{K} \Gamma f(\phi_p)$$

-continued $$\theta_p(n+1) = \theta_p(n) + u_\theta \sum_{k=1}^{K} \Gamma f(\theta_p)$$

for each polarization. In some embodiments, K=16. The gradient functions $\Gamma f(\phi_p)$ and $\Gamma f(\phi_p)$ may be found from the lock detector function $f(\theta_p, \phi_p)$ using a steepest decent algorithm, in a manner that will be apparent to those of ordinary skill in the art. The update step sizes $u_\phi$ and $u_\theta$ are programmable values that can be set based on a desired balance between response time and precision of the adaptation loop 38. This operation of the adaptation loop 38 automatically controls the values for the phase and angle coefficients $\phi(n+1)$ and $\theta(n+1)$ to optimise (in this case, to maximize) the lock detector function $f(\theta_p, \phi_p)$ value.

As will be appreciated limiting the degrees of freedom of the inverse Jones matrix to two parameters $\theta_p$ and $\phi_p$ in the above manner reduces computational complexity, particularly of the coefficient calculator 40, while still achieving sufficient polarization compensation performance to enable reliable clock recovery.

At the output of the optimization block 26, the respective elements of each of the LSB and USB signals are added to yield corresponding TOTAL-LSB and TOTAL-USB signals that are substantially independent of polarization effects. Each element of the TOTAL-LSB signal is then multiplied with the complex conjugate of the corresponding element of the TOTAL-USB signal. The products are added together to form a composite signal that is a single multi-bit complex value, of which the mean of the imaginary term is proportional to the A/D sample clock (i.e. the VCO output 36) phase error relative to symbols of the received optical signal, and the mean of the real term is a "lock value" indicative of a degree to which the VCO output 36 is frequency and phase-locked to the received optical signal. Thus, the phase detector 30 may conveniently be implemented as a pair of summation circuits, as may be seen in FIG. 4A. A first summation circuit 42 sums the imaginary term of the composite signal over a predetermined number of occurrences in time (e.g. 1 or 8 samples) to obtain a clock phase estimate 44, which is then passed to the loop filter 32. At the same time, the second summation circuit 46 sums the real term over a predetermined number of occurrences (e.g. 1 or 8 samples) to obtain a "lock value"

$$f(\theta_p, \phi_p) = \text{Re}\left[\sum_{k=1}^{K} S_{opt}^{USB}(k) * S_{opt}^{LSB}(k)\right],$$

which is then passed to a lock detector 48. Thus, the real and imaginary parts of the products are summed over the frequency range (e.g. 16 points of the FFT) and then summed over a time interval (e.g. 1 or 8 samples) to produce estimates proportional to the mean values.

Figure 4A:
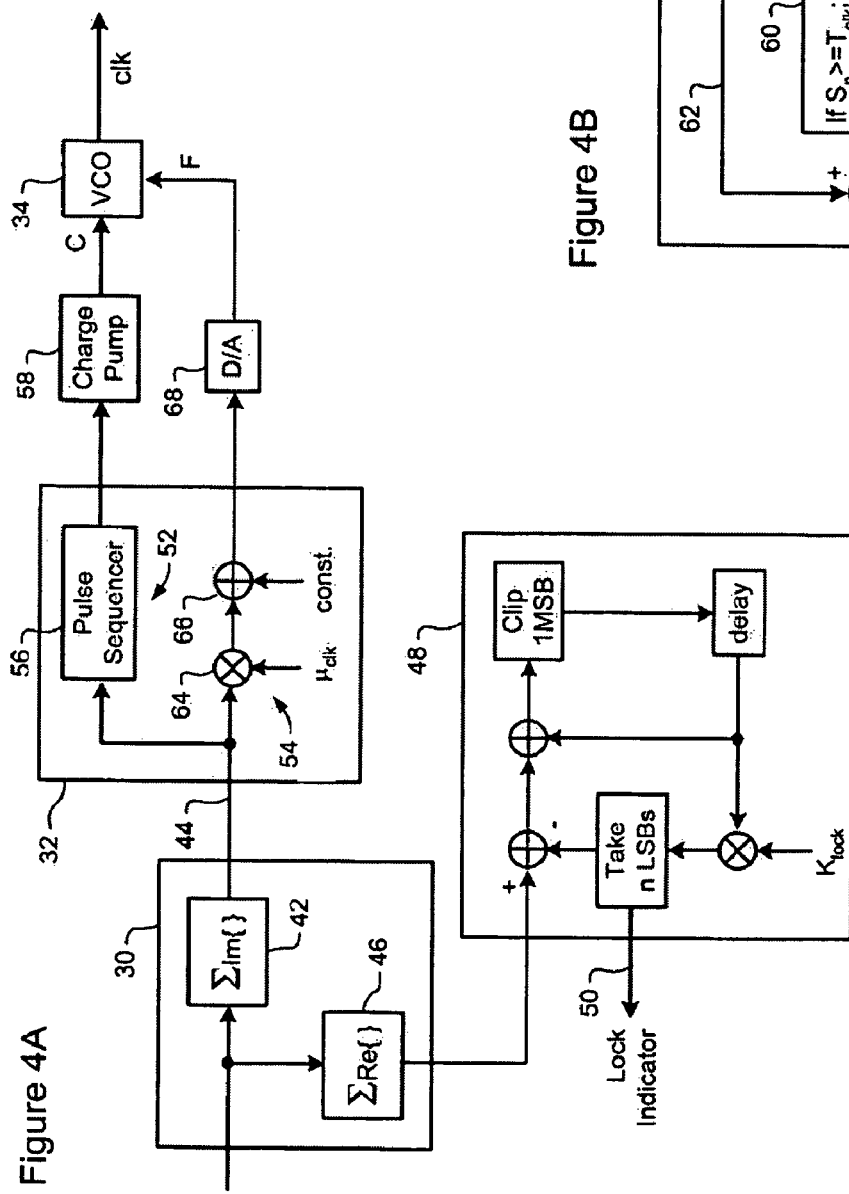
FIGS. 4A-4B are block diagrams schematically illustrating representative operations of the phase detector, loop filter, VCO and lock detector of the embodiment of FIG. 2.
Figure 4B:
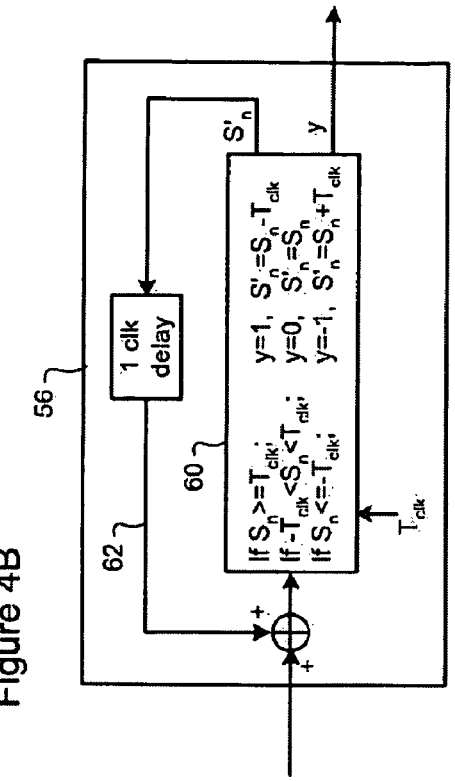

A representative lock detector 48 is illustrated in FIG. 4A. In the illustrated embodiment, the lock detector 48 is configured as an Infinite Impulse Response (IIR) filter which averages successive $f(\theta_p, \phi_p)$ values to avoid spurious changes in the lock state of the PLL. A programmable averaging constant $K_{lock}$ is selected based on the desired IIR filter response, in a manner that will be apparent to those of ordinary skill in the art. The IIR output is the lock indicator 50, and can be used by a control unit (not shown) for processing and control/monitoring functions. The value of the lock indicator 50 signal can also be used to determine the PLL loop bandwidth, which enables the loop filter step size $\mu_{clk}$ (described below) to be set based on a desired loop bandwidth.

The loop filter 32 receives the phase estimate 44 from the phase detector 30, and supplies a pair of control signals to the coarse (C) and fine (F) tuning ports of the voltage controlled Oscillator (VCO) 34 which may, for example, be a conventional 11 GHz VCO. In general, the loop filter 32 adjusts damping and resonance frequency for the $2^{nd}$ order phase locked loop. As may be seen in FIG. 4A, the loop filter 32 includes a coarse tuning path 52 and a fine tuning path 54. The coarse tuning path 52 comprises a pulse sequencer 56 which generates a tri-state digital pulse stream (y=−1, 0, 1) which drives an analog charge pump integrator 58 coupled to the coarse tuning port of the VCO 34. The pulses sequencer 56 is shown in greater detail in FIG. 4B, in which $T_{clk}$ is a programmable parameter based on a desired sensitivity of the pulse sequencer. The pulse sequencer 56 implements a digital integrator 60 which combines with the analog charge pump integrator 58 to form a single integrator with fine resolution and broad range, not limited by the precision of a Digital-to-Analog (D/A) circuit. The feedback path 62 inside the pulse sequencer 56 subtracts off from the digital integrator 60 the digital value (Tclk) that corresponds to the analog charge that has been sent to the analog integrator 58, and thereby couples the two integrators to act as one.

The fine tuning path 54 comprises a multiplier 64 for scaling the phase estimate 44 from the phase detector 30, for example using a programmable step size $\mu_{clk}$, and an adder 66 for offsetting the scaled phase estimate to a desired value range (e.g. by adding a constant). As will be appreciated, the step size $\mu_{clk}$ may be selected based on a desired bandwidth of the phase locked loop, which will be a balance between pull in range, response time and sensitivity. The output of the fine tuning path 54 is supplied to the fine tuning port of the VCO 34 via a digital-to-analog (D/A) converter 68.

The arrangement of FIGS. 2-4A-B is capable of successfully recovering a clock signal from a received optical signal, even in the presence of severe impairments. For example, as mentioned above, the FFT filters 24 substantially compensate dispersion of the inbound optical signal Selection and processing of the USB and LSB signals through the optimization block 26 enables the phase detector 30 to detect the A/D sample clock phase, in the presence of significant amounts of residual dispersion. For example, in some embodiments, successful phase detection in the presence of about 3000 ps/nm residual dispersion can be obtained. The ability of the optimization block 26 to track, and thus compensate polarization transients, is a function of the adaptation time of the coefficient calculator. For example, in an embodiment in which the received optical signal has a symbol rate of 10 GHz, a polarization update rate on the order of 100 MHz may be selected. With this repetition rate, the coefficient calculator 40 can operate fast enough that the filter coefficients $\theta_p(n+1)$ and $\phi_p(n+1)$ can be recomputed and uploaded to the optimization block 26 during each cycle. This translates into an adaptation time on the order of 100 ns (equivalent to 10 MHz), which is fast enough to accurately track, and thus compensate polarization transients of 50 MHz or higher.

In practice, there are situations in which it will be desired to run the clock recovery circuit when a usable clock signal cannot be recovered from a received optical signal. Examples of such situations include, without limitation:

during factory testing, where it is desirable to test operation of a receiver which uses the VCO output 36, but no optical signal may be present at the receiver input;

following installation and start-up of such a receiver in a network, where it is desirable for the receiver to be "live", but there is no optical signal present in the fiber. In such a condition, which could persist for extended periods of time, light received through the network may consist primarily of Amplified Spontaneous Emission (ASE), or be absent entirely.

In the absence of a useful received optical signal, the phase detector output 44 will contain only noise, and the loop filter 32 of FIGS. 2-4 will thus be unable to generate useful signals for tuning the VCO 34. FIG. 5 illustrates a development of the system of FIGS. 2-4, in which a reference clock is used to generate tuning signals which can be used to tune the VCO 34 when there is no recoverable clock in the received optical signal.

Figure 5A:
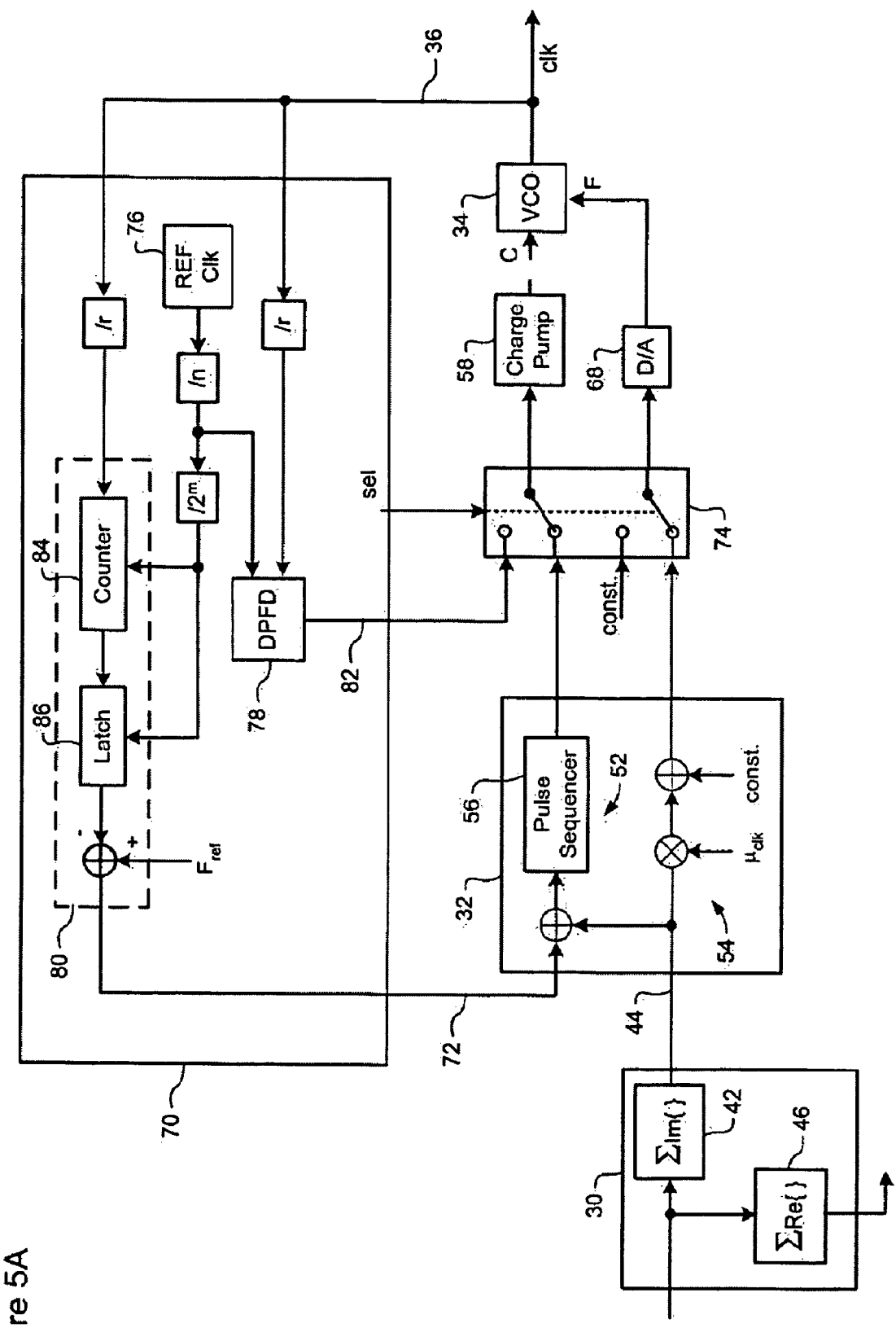
FIGS. 5A and 5B are block diagrams schematically illustrating representative operations a clock recovery circuit according to a second embodiment of the present invention.
Figure 5B:
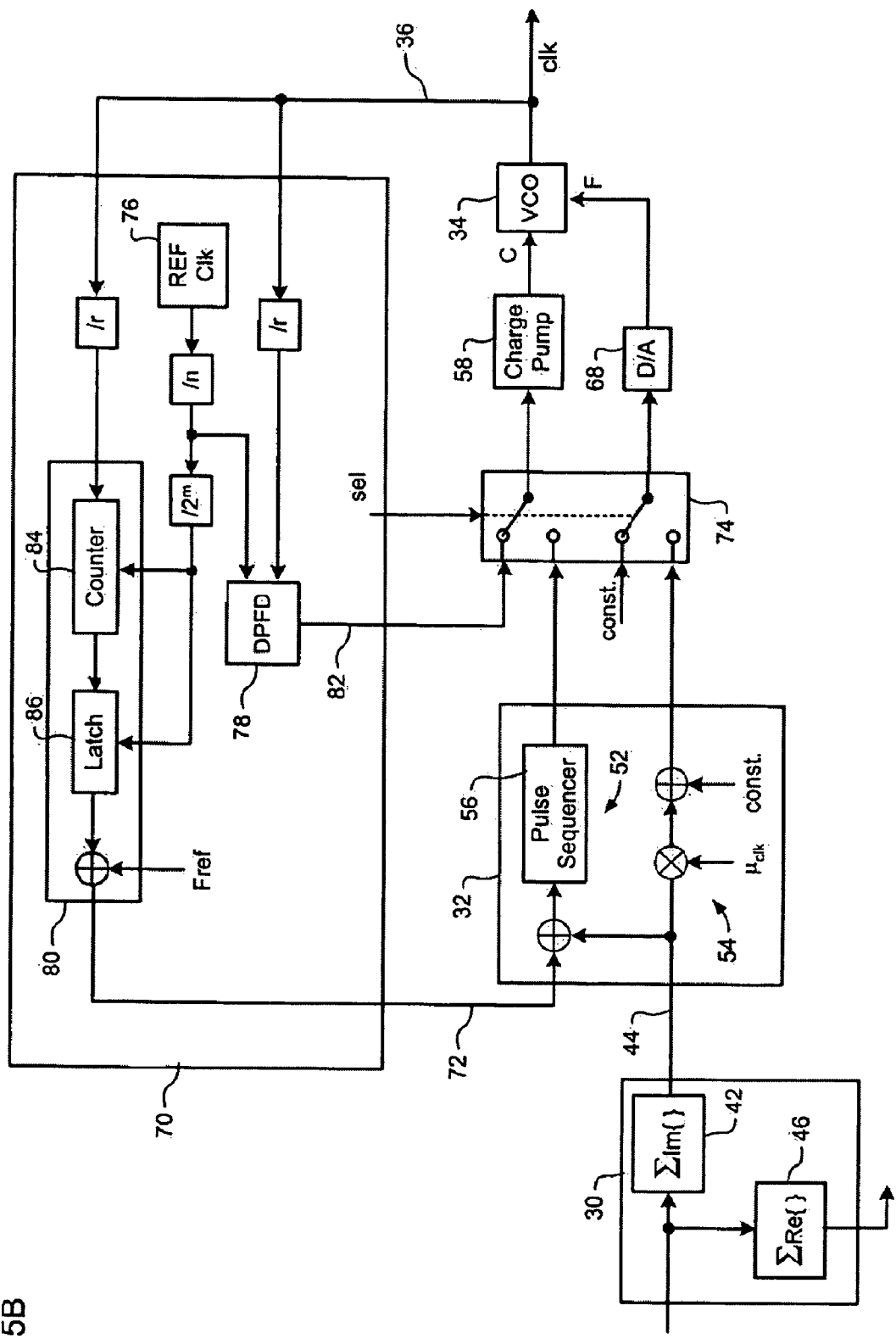

The embodiment of FIG. 5 is similar to that of FIGS. 2-4, the primary difference being that the coarse tuning path 52 of the loop filter 32 receives a frequency error signal 72 from a timing reference 70, and a switch block 74 is inserted into the signal path at the output of the loop filter 32. The switch block 74 is controlled by a select signal and operates to latch the PLL between a "test" state in which the VCO 34 is tuned to a reference clock 76, and an "operational" state in which the VCO 32 is tuned to the received optical signal. FIG. 5A illustrates the "operational" state of the PLL, and FIG. 5B illustrates the "test" state.

Referring now to FIG. 5A, the timing reference 70 includes a reference clock 76, digital phase/frequency detector (DPFD) block 78 and a frequency detector 80. The reference clock 76 is a comparatively stable oscillator which generates a clock signal having a frequency that is in known proportion to a desired operating frequency of the VCO 34. Typically, the reference clock frequency will be set at 1/r times the VCO frequency, where r is an integer value. In some embodiments r=16, but other values may equally be used. The DPFD block 78 implements conventional methods to measure the phase and frequency of the VCO output signal 36 relative the reference clock 76, and outputs a tristate signal (y=−1, 0, 1) 82 indicative of whether the VCO frequency should be incremented, decremented or none. This is generally useful for factory test modes.

The frequency detector 80 may conveniently be implemented using a digital counter 84 and a latch 86, and measures the frequency of the VCO output signal 36. Subtracting the measured VCO frequency from a "target" frequency value $F_{ref}$ yields a multi-bit estimate of the VCO frequency error 72. This error estimate is supplied to the coarse tuning path 52 of the loop filter 32, where it is added to the output 44 of the phase detector 30 immediately upstream of the pulse sequencer 56. This is generally useful to keep the VCO 34 centered on the desired frequency when the clock is not locked to a valid optical signal.

As shown in FIG. 5A, in the "operational" state, the tristate output 82 of the DPFD block 78 is discarded in favour of the course and fine tuning paths 52, 54 of the loop filter 32. As a result, the clock recovery circuit operates substantially as described above with reference to FIGS. 2-4. However, the pulse sequencer 56 also receives the frequency error estimate 72 from the frequency detector 80. In the absence of a useful received optical signal, the pulse sequencer 56 will operate entirely on the basis of this error estimate 72, which ensures that the coarse tuning path 52 can tune the VCO frequency to within the pull-in range of the fine tuning path 54 of the PLL.

As may be appreciated, with the VCO 34 being tuned to the reference clock 76 via the frequency detector 80, the VCO output 36 provides a nominal clock which can be used for initial acquisition of an optical signal. In particular, the frequency detector and coarse tuning path 52 of the PLL will hold the VCO frequency within about ±120 ppm of the received optical signal. With Nyquist sampling, this error is sufficiently small that the sample streams generate by the A/D converters 22 will contain sufficient information to enable the receiver to acquire the optical signal As is known in the art, at initial start-up the VCO frequency may be as much as ±10% off the target frequency. This places a lower bound on the required pull-in range of the coarse tuning path 52 of the PLL, so that the VCO frequency can be acquired at start-up and then pulled into the pull-in range of the fine tuning path 54.

On the other hand, when a usable optical signal is present, the phase detector output 44 will contain useful phase information, and the pulse sequencer can successfully operate on the basis of that information, locking the VCO 34 to twice the symbol rate of the received optical signally. By suitably designing the response of the frequency detector 80, at is possible to arrange that the error estimate 72 under these frequency conditions is zero, so that the frequency detector output does not interfere with valid phase estimates outputs by the phase detector 30.

For example, clock circuits used in communications systems typically have a frequency tolerance of about ±40 ppm. This means that, under normal operating conditions, tuning the VCO 34 to the received optical signal (and thus the Tx local clock at the transmitter end of the optical link) may result in the frequency detector 80 measuring a frequency "error" of up to 80 ppm, due to accumulated tolerances of both the Tx local clock and the reference clock 76. However, if the frequency detector response is chosen to be insensitive to frequency errors of less than ±80 ppm, then the error estimate produced by the frequency detector 80 will be suppressed. One method of accomplishing this is to apply a thresholding function to the frequency detector output, which forces detector output values of between −80 ppm and +80 ppm to zero. An alternative method is to clip a number of least significant bits representing at least ±80 ppm from the multi-bit frequency detector output, so that only the most significant bits are supplied to the loop filter. In either case, the insensitivity of the frequency detector 80 means that, when a useful optical signal is received, there could be as much as 120 ppm (combining the ±80 ppm insensitivity of the frequency detector 80 with the ±40 ppm frequency tolerance of the Tx local clock) difference between the received optical signal and the VCO frequency. Clearly, this value will be different in embodiments in with clock frequency tolerances are other than ±40 ppm. However, in all cases, this frequency difference sets a lower limit on the required pull-in range of the fine tuning path 54 of the PLL.

As may be seen in FIG. 5B, in the "Test" state, the tristate output of the DPFD block 78 is supplied to the coarse tuning port of the VCO 34 via the charge pump 58, and thereby tunes the VCO 34 to the reference clock 76. The D/A converter 68 connected to the fine tuning port can also be supplied with a constant value (e.g. zero) so that the D/A output does not float undesirably. In this state, the loop filter 32 receives phase information from the chase detector 30 as well as frequency error information from the frequency detector 80. However, the loop filter output is not used to tune the VCO 34. As will be appreciated, since the VCO 34 is being tuned to the reference clock 76, the VCO frequency may differ from the Tx local clock by as much as ±80 ppm, depending on the frequency tolerances of the Tx local clock and the reference clock 76, which is within the pull-in range of the fine tuning path 54 of the PLL. Accordingly, the clock recovery circuit can be latched between the "Test" and "Operational" states without requiring a reset.

When the received optical signal contains significant amounts of Polarization Mode Dispersion (PMD) and/or Polarization Dependent Loss (PDL), there are conditions under which the clock recovery circuits of FIGS. 2-5 cannot reliably obtain a lock condition. For example, consider a condition in which two components of the received optical signal are out of phase (due to PMD) by about ½ of a symbol period. In an out-of lock condition, clock phase estimates 44 generated by the phase detector 30 will exhibit random excursions and average near zero. The lock indicator signal 50 obtained by averaging successive $f(\theta_p,\phi_p)$ values in the lock detector 48 will also be near zero, as will be the gradient functions $\Gamma f(\phi_p)$ and $\Gamma f(\theta_p)$. Consequently, successive updates to the inverse Jones matrix filter coefficients $\theta_p(n+1)$ and $\phi_p(n+1)$ will also be near to zero as there is zero gradient, and thus the optimization block 26 will be effectively "frozen". The resulting inability of the optimization block 26 to track polarization transients reduces then likelihood of reacquiring a locked condition. This situation may persist for an indeterminate amount of time until a lock condition is achieved.

This situation may be prevented by forcing the filter coefficients $\theta_p(n+1)$ and $\phi_p(n+1)$ to slowly sweep the Poincaré sphere, and examining the phase detector output for a locked condition using a high speed lock detector. A representative implementation of this approach is illustrated in FIGS. 6 and 7.

Figure 6:
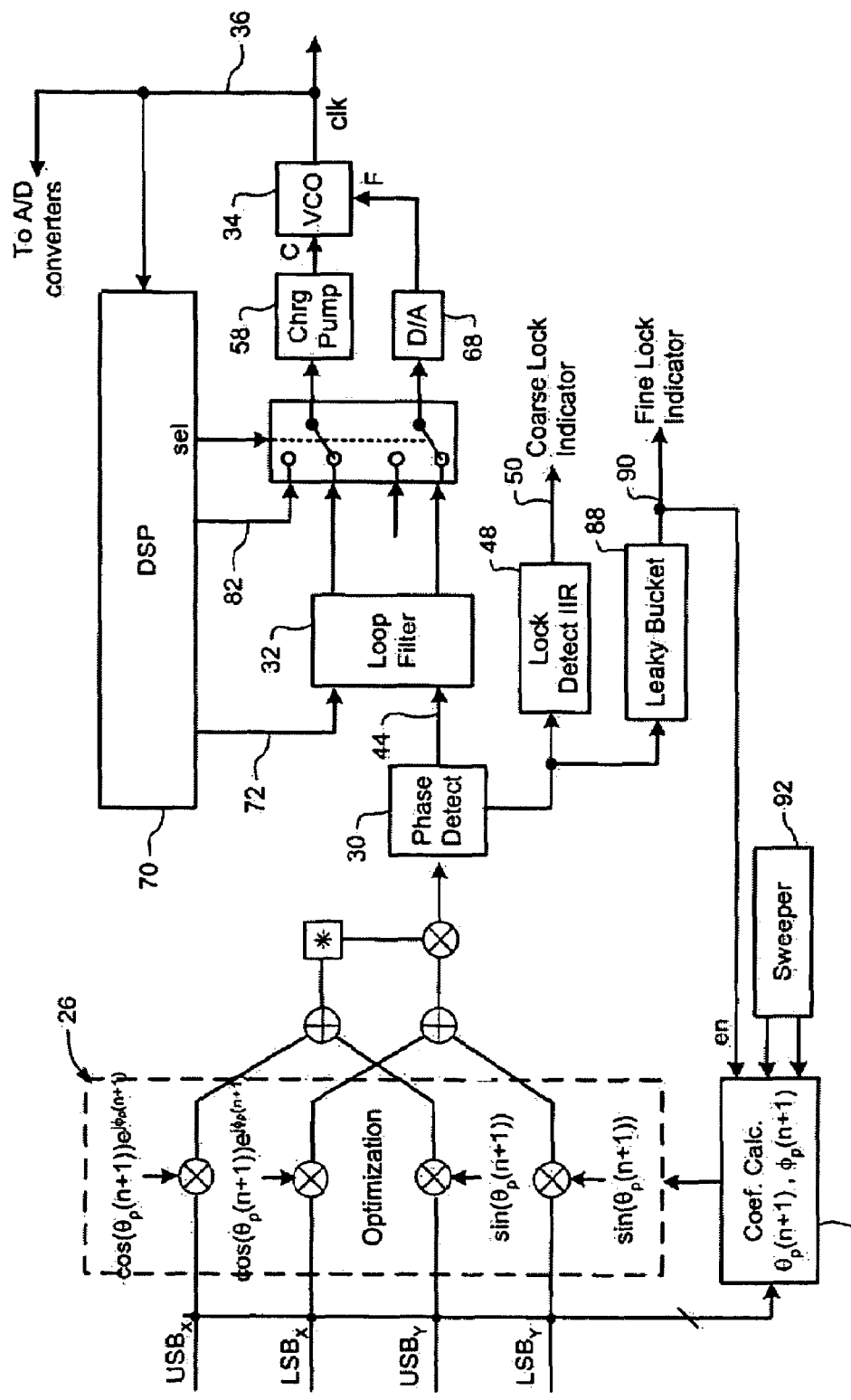
FIG. 6 is a block diagram schematically illustrating representative operations of a third embodiment of the present invention.

As may be seen in FIG. 6, the IIR filter-based lock detector 48 of FIGS. 2-5 is retained to provide a coarse lock indication. However, this is supplemented with a fine filter 88, which has a lower memory effect and thus faster response than the IIR filter 48. As will be appreciated, various types of filter circuits may be used, provided that they exhibit a sufficiently fast response and are relatively insensitive to noise. A commonly known filter type that can be used for this purpose is a so-called "leaky bucket" filter, which is illustrated in the figures. The output of the Leaky Bucket filter 88 provides a fine lock indicator signal 90, which is used to enable operation of a sweeper circuit 92 for driving the coefficient calculator 40. This operation is illustrated in greater detail in FIG. 7.

Figure 7:
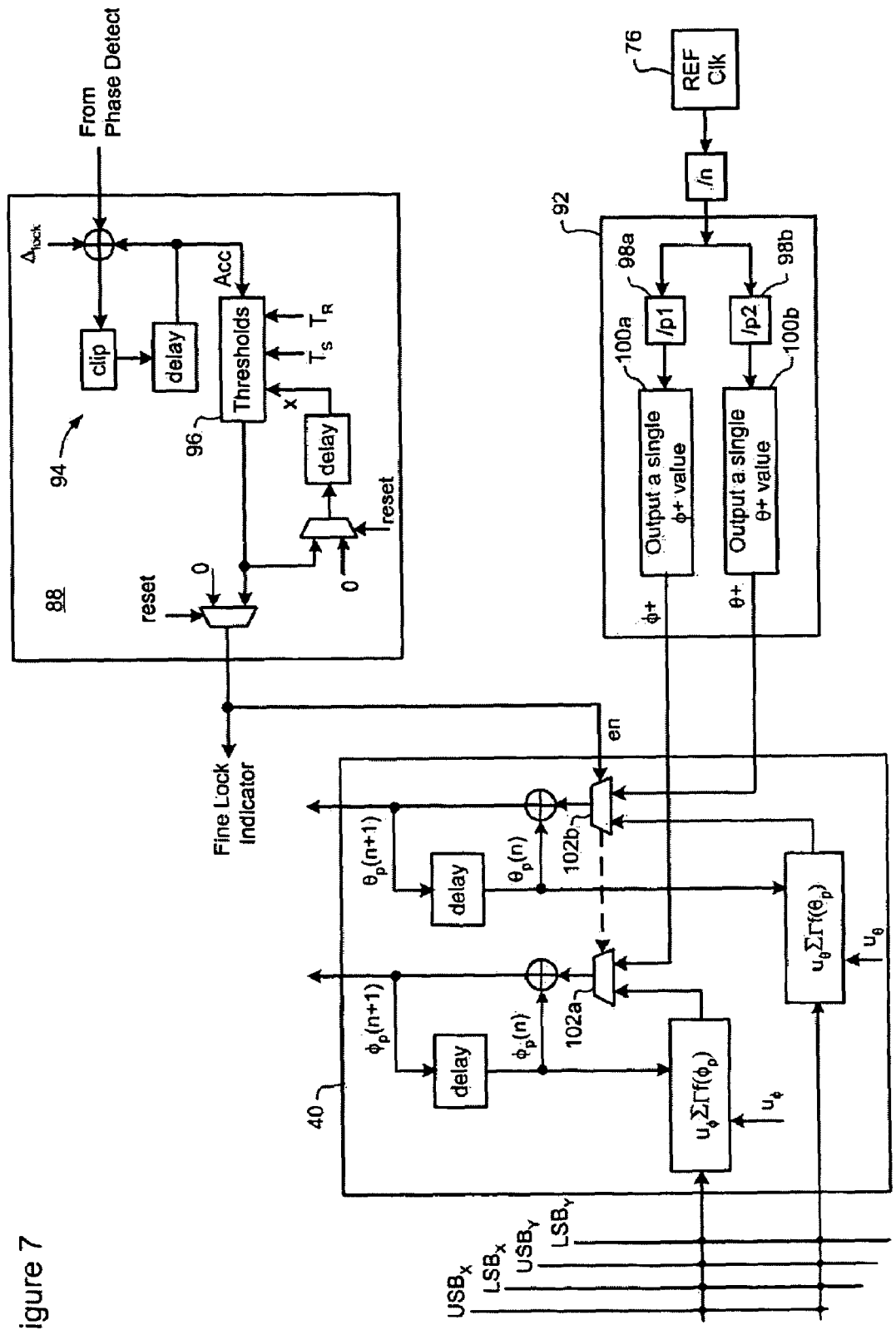
FIG. 7 is a block diagram schematically illustrating representative operations of the sweeper block and coefficient calculator of FIG. 6 in greater detail.

As may be seen in FIG. 7, the Leaky Bucket filter 88 provides a low-memory averaging function 94 and a threshold comparison block 96 to provide a high-speed, "clean" lock indication. The leak rate ($\Delta_{lock}$) is a programmable negative valve that nay, be selected based on a desired response of the filter. The governing thresholds $T_s$ and $T_r$ are also programmable. Representative state transitions of the Thresholding block 96 are as follows:

| x | Sweeping | Acc | Output | Meaning |
|---|---|---|---|---|
| 0 | No | >Ts | 0 | continue |
| 0 | No | <Tr | 1 | Lock lost - Start Sweeping |
| 1 | Yes | >Ts | 0 | Lock Acquired - Stop Sweeping |
| 1 | Yes | <Tr | 1 | continue |

Referring again to FIG. 7, the sweeper 92 provides a pair of parallel frequency dividers 98a,b which respectively divide a clock signal frequency by p1 and p2. The clock signal may conveniently be provided by the reference clock 76 of the timing reference 70, but a different clock signal source may be used, if desired. The divisors p1 and p2 are preferably prime numbers, which prevents aliasing effects, and have different values so that the filter coefficients $\theta_p(n+1)$ and $\phi_p(n+1)$ will be swept at correspondingly different rates. In a representative embodiment, p1=953 and p2=9533, which provides about an order of magnitude difference in the sweep rates of the filter coefficients. The output of each frequency divider 98a,b is a trigger signal which causes a respective buffer 100a,b to output multibit increments θ+ and φ+ at its trigger signal frequency. The value of each increment is preferably a programmable value, which is set based on a desired step size. The increment values θ+ and φ+ generated by the sweeper 92 are then supplied to the coefficient calculator 40.

Within the coefficient calculator 40, the increment values θ+ and φ+ are supplied to respective latch circuits 102a,b, which also receive the summed gradient values $$u_\phi \sum_{k=1}^{K} \Gamma f(\phi_p) \text{ and } u_\theta \sum_{k=1}^{K} \Gamma f(\theta_p).$$

Each latch circuit 102 is controlled by an "enable signal" obtained from the fine lock indicator signal output by the Leaky Bucket filter 88. As a result, when the clock recovery circuit is "locked", the "enable" signal is low, and the latch circuits 102 select the summed gradient values $$u_\phi \sum_{k=1}^{K} \Gamma f(\phi_p) \text{ and } u_\theta \sum_{k=1}^{K} \Gamma f(\theta_p).$$

In this state, the coefficient calculator 40 updates the filter coefficients $\theta_p(n+1)$ and $\phi_p(n+1)$ according to the equations:

$$\phi_p(n+1) = \phi_p(n) + u_\phi \sum_{k=1}^{K} \Gamma f(\phi_p)$$

$$\theta_p(n+1) = \theta_p(n) + u_\theta \sum_{k=1}^{K} \Gamma f(\theta_p)$$

as described above with reference to FIGS. 2-5. However, when the clock recovery circuit is "un-locked", the "enable" signal goes high, and the latch circuits 102 select the increment values θ+ and φ+ generated by the sweeper 98. In this state, the coefficient calculator 40 updates the filter coefficients $\theta_p(n+1)$ and $\phi_p(n+1)$ according to the equations:

$\phi_p(n+1)=\phi_p(n)+(\phi+)$ $\theta_p(n+1)=\theta_p(n)+(\theta+)$ which forces the filter coefficients $\theta_p(n+1)$ and $\phi_p(n+1)$ to vary in accordance with the magnitude of the increment values θ+ and φ+, and the frequency with which these values are output by the sweeper 98. In a representative embodiment in which p1=953, p2=9533, θ+=φ+=64 and the clock period is 6 nS, the filter coefficients $\theta_p(n+1)$ and $\phi_p(n+1)$ rotate at about 600 Hz and 60 Hz, respectively. In such embodiments, the choice of prime numbers for the divisors p1 and p2 results in the filter coefficients $\theta_p(n+1)$ and $\phi_p(n+1)$ evenly covering the Poincaré sphere with a pattern that repeats every 20 seconds.

The forced sweeping of the filter coefficients moves them away from whatever regions of the Poincaré sphere that would otherwise have currently prevented reacquisition of "lock". Embodiments using the above parameters can attain a worst case average hunt time of less than 5 ms.

Figure 8:
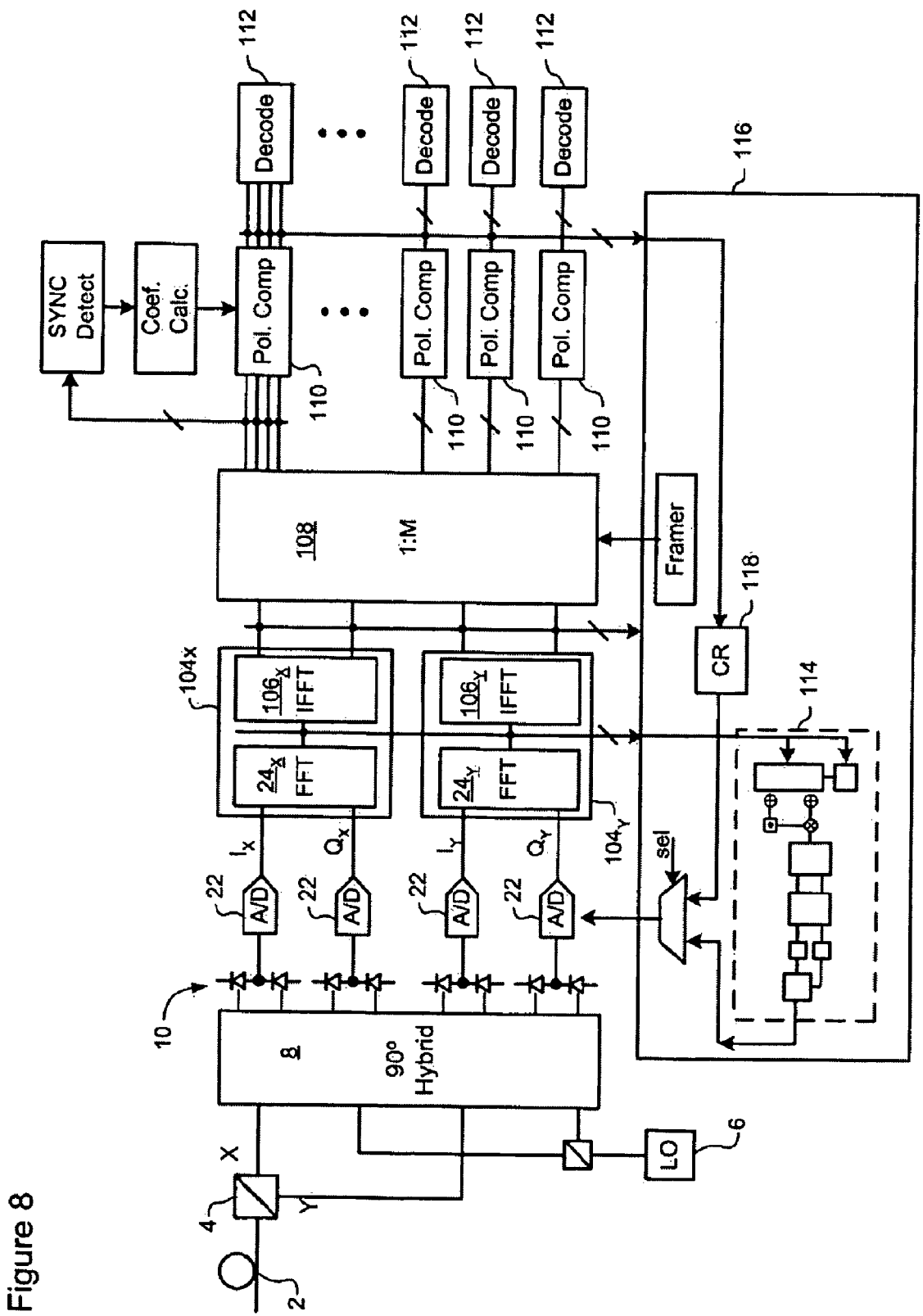
FIG. 8 is a block diagram schematically illustrating a representative coherent optical receiver which incorporates a clock recovery circuit in accordance with an embodiment of the present invention.

FIG. 8. illustrates a representative coherent optical receiver in which the clock recovery circuit of FIGS. 2-7 is implemented. In the embodiment of FIG. 8, an inbound optical signal is received through an optical link 2, split into orthogonal polarizations by a Polarization Beam Splitter 4 and then mixed with a Local Oscillator (LO) signal 6 by a conventional 90° optical hybrid 8. The composite optical signals emerging from the optical hybrid 8 are supplied to respective photodetectors 10, which generate corresponding analog signals. The photodetector signals are sampled by respective Analog-to-Digital (A/D) converters 22 to yield multi-bit digital sample streams corresponding to In-phase (I) and Quadrature (Q) components of each of the received polarizations.

From the A/D converter 22 block, the I and Q sample streams of each received polarization are supplied to a respective dispersion compensator 104, which operates on the sample stream(s) to compensate chromatic dispersion of the optical link. In the embodiment of FIG. 8, each dispersion compensator 104 is implemented using a Fast Fourier Transform (FFT) filter 24 cascaded with an Inverse Fast Fourier Transform (IFFT) filter 106.

The dispersion-compensated sample streams appearing at the output of the dispersion compensators 104 are then supplied to a 1: M distribution unit 108, which operates to divide the signal path, by selectively routing blocks of samples from the dispersion compensators 104 into each one of the M paths. Within each path, a polarization compensator 110 operates to de-convolve the transmitted I and Q signal components of each polarization from the dispersion-compensated sample streams. The distortion-compensated sample streams appearing at the output of each polarization compensator 110 are then supplied to a respective decoder 112 for detection of data symbols and recovery of data.

As may be seen in FIG. 8, the clock recovery circuit utilizes the receiver "front end" to receive and detect the optical signal. The Uppers Side Band (USB) and Lower Side Band (LSB) signals are tapped at the output of the dispersion compensator FFTs 24, and supplied to a signal processor block 114 which includes the optimization block 26, phase detector 30, loop filter 32 and VCO 34 all of which operate as described above with reference to FIGS. 2-7 to generate a recovered clock signal, which is used to drive the A/D converters 22 and other operations of the receiver. If desired, the signal processor block 114 can be incorporated within a controller unit 116 of the receiver, which can also provide the functionality of the timing reference described above; with reference to FIGS. 5-7. This controller unit 116 is advantageously implemented as part of an ASIC or FPGA, but some or all can be implemented in Digital Signal Processor (DSP) firmware.

As may be seen in FIG. 8, an alternative clock recovery method may be implemented in which a clock signal is recovered by a clock recovery circuit 118 using the fully compensated signals available at the output of the polarization compensators 110. As will be appreciated, conventional clock recovery methods may be used to obtain a valid clock signal from the fully compensated signals, subject to the limitation that the delay between the sampling instant and the application of the feedback to the VCO limits the achievable bandwidth and transfer function of the PLL. More processing introduces more delay within this loop. In cases where the signal output from any one polarization compensator may be discontinuous, another method may be used, which operates on the sample blocks generated by the distribution unit 108. In this case, the phase and/or frequency of a symbol clock, representative of the symbol rate within a block of samples can be determined using methods described by L. E. Franks in *Carrier and Bit Synchronization in Data Communication—a Tutorial Review*, IEEE Transactions on Communications, Vol. Com-28, No. 8, August 1980. This information can be used to adjust the A/D converter sampling clock for future samples, thereby forming a phase-locked loop. Alternatively, the symbol clock can be used in performing interpolation between the existing samples of the sample block to derive interpolated samples which closely approximate the timing (i.e. the phase) of symbols within the sample block. Interpolation methods such as Fourier interpolation are known in the art of digital signal processing. If there is a sufficient degree of over-sampling, such as 4× or 10× the symbol rate, for example, interpolation may not be required and a reasonably close sample can be chosen for each symbol. Once a set of samples that are adequately aligned with the symbols have been identified (or derived by interpolation) the set of samples can then be decoded to determine the values of those symbols.

A limitation of such approaches is that they generally cannot be implemented until the dispersion and polarization compensators are running and have stabilized, and this cannot reliably happen without a valid clock signal. This limitation becomes very strong for cases with significant dispersion or time varying polarization effects. However, the clock recovery circuit of FIGS. 2-7 can be used to provide a valid clock signal during a start-up phase of the receiver, following which it is possible to switch to a clock signal recovered from the polarization compensator output. Alternatively, the clock signal recovered from the polarization compensator output can be used for monitoring a quality of operation of the clock recovery circuit of FIGS. 2-7

In the embodiments described above with reference to FIGS. 2-8, the multi-bit digital sample stream generated by the A/D converter 22 block is digitally processed by an FFT filter 24 cascaded with an optimization block 26, and the resulting optimized (that is, compensated) signal supplied to the phase detector 30 for clock phase detection and control of the VCO 34. The FFT filter 24 performs a spectral analysis of the digital sample stream, and applies a dispersive function to compensate dispersion of the optical link 2. The optimization block implements a simplified inverse Jones matrix to compensate polarization impairments. It will be appreciated, however, that there are means by which dispersion and polarization compensation may be provided. For example, filter types other than a FFT filter may be used for dispersion compensation. Similarly, filter types other than an inverse Jones matrix may be used for polarization compensation.

The optical link 2 may be provided with optical dispersion compensation in a manner well known in the art. In such a case, the FFT filter 24 (or any other electronic dispersion compensation) may be redundant, and thus omitted. In such cases, the digital sample streams emerging from the A/D converter 22 block can be supplied directly to the optimization block 26 for polarization compensation. If desired, an FFT filter can be retained to perform a spectral analysis (i.e. without applying a dispersive function), but this is not essential. The tapping of upper side band *USB and lower sidle band (LSB) signals is advantageous because it reduces the required size of the optimization block, and thus system cost. However, those of ordinary skill in the art will appreciate that the clock phase can equally be detected from the entire digital sample stream, if desired.

Similarly, in an optical link in which polarization effects are minimal, or can be adequately managed by means of optical techniques, the optimization block 26 and adaptation loop 38 may be omitted. USB and LSB signals can be tapped at the output of the FFT filter 24 and supplied to the phase detector, if desired, but the entire dispersion compensated signal may equally be used.

The embodiment(s) of the invention described above is(are) intended to be illustrative only. The scope of the invention is therefore intended to be limited solely by the scope of the appended claims.

We claim:

1. A method of recovering a clock signal from a high speed optical signal received through an optical communications network, the method comprising steps of:
    processing a stream of multi-bit digital samples of the optical signal to generate a polarization compensated signal; and
    deriving the recovered clock signal using the polarization compensated signal;
    wherein processing the stream of multi-bit digital samples comprises:
        selecting a portion of the multi-bit digital sample stream; and
        filtering the selected portion using an inverse Jones matrix.

2. A method as claimed in claim 1, wherein the steps of processing the multi-bit digital sample stream and deriving the recovered clock signal are pipelined such that the clock signal is recovered substantially in real time with reception of the optical signal.

3. A method as claimed in claim 1, wherein the step of processing the stream of digital samples comprises a step of processing respective multi-bit digital sample streams corresponding to each received polarization of the optical signal, in parallel.

4. A method as claimed in claim 3, wherein the step of processing respective multi-bit digital sample streams corresponding to each received polarization comprises, for each polarization, processing a parallel pair of digital sample streams respectively corresponding to In-Phase and Quadrature components of the polarization.

5. A method as claimed in claim 1, wherein the step of selecting a portion of the multi-bit digital sample stream comprises a step of tapping an upper side band (USB) and a lower side band (LSB) of the multi-bit digital sample stream.

6. A method as claimed in claim 5, wherein the USB and LSB signals are tapped from a Fast Fourier Transform (FFT) computed over the multi-bit digital sample stream.

7. A method as claimed in claim 1, wherein the inverse Jones matrix is a simplified inverse Jones matrix having respective phase and angle filter coefficients for each polarization.

8. A method as claimed in claim 7, further comprising a step of computing updated filter coefficients at a predetermined adaptation rate.

9. A method as claimed in claim 8, wherein the predetermined adaptation rate is on the order to 1 MHz or higher.

10. A method as claimed in claim 8, wherein the step of computing updated filter coefficients comprises computing respective phase and angle coefficient values, for each polarization, which optimize a phase lock indicator function.

11. The method as claimed in claim 10, wherein the phase lock indicator function is $$f(\theta_p, \phi_p) = \text{Re}\left[\sum_{k=1}^{K} S_{opt}^{USB}(k) * S_{opt}^{LSB}(k)\right],$$

where $S_{opt}^{USB}(k)$ and $S_{opt}^{LSB}(k)$ are upper side band and lower side band signal portions, respectively, of the compensated signal; and wherein the step of computing updated filter coefficients comprises computing the equations:

$$\phi_p(n+1) = \phi_p(n) + u_\phi \sum_{k=1}^{K} \Gamma f(\phi_p)$$

$$\theta_p(n+1) = \theta_p(n) + u_\theta \sum_{k=1}^{K} \Gamma f(\theta_p)$$

where:

$$u_\phi \sum_{k=1}^{K} \Gamma f(\phi_p) \text{ and } u_\theta \sum_{k=1}^{K} \Gamma f(\theta_p)$$

are summed gradient values derived from the phase lock indicator function; and $u_\phi$ and $u_\theta$ are update step sizes.

12. A method as claimed in claim 10, wherein the step of computing updated filter coefficients further comprises steps of:
    computing a respective update increment for each filter coefficient which, when added to a current coefficient value optimizes the phase lock indicator function;
    obtaining a respective sweeper increment for each filter coefficient which, when added to the current coefficient value sweeps the respective filter coefficient at a predetermined rate;
    selecting one of the update increments and the sweeper increment; and
    computing updated filter coefficients using the selected increments.

13. A method as claimed in claim 12, wherein the step of obtaining a respective sweeper increment for each filter coefficient comprises, for each filter coefficient, generating the respective sweeper increment value at a predetermined repetition rate.

14. A method as claimed in claim 12, wherein the predetermined repetition rate is determined by frequency dividing a reference clock signal by a prime number divisor.

15. A method as claimed in claim 12, wherein the predetermined repetition rate of one sweeper increment value is about 10 times that of another sweeper increment value.

16. A method as claimed in claim 1, wherein the step of processing the stream of digital samples further comprises compensating dispersion of the optical signal.

17. A method as claimed in claim 16, wherein the step of compensating dispersion is performed prior to compensation of polarization impairments of the optical signal.

18. A method as claimed in claim 16, wherein the step of compensating dispersion of the optical signal comprises steps of:
    computing a Fast Fourier Transform (FFT) of the digital sample stream; and
    applying a dispersive function to the computed FFT.

19. A method as claimed in claim 1, wherein the step of deriving the recovered clock signal comprises a step of detecting a clock phase using the polarization compensated signal.

20. A method as claimed in claim 19, wherein the step of detecting a clock phase comprises steps of:
selecting an upper side band (USB) and a lower side band (LSB) of the compensated signal; and
processing the USB and LSB signals to detect the clock phase.

21. A method as claimed in claim 20, wherein the USB and LSB signals are selected by tapping a Fast Fourier Transform (FFT) computed over the multi-bit digital sample stream.

22. A method as claimed in claim 20, wherein the step of processing the USB and LSB signals comprises steps of:
combining the USB and LSB signals to derive a composite signal value; and
computing a phase error value from the composite signal value.

23. A method as claimed in claim 22, wherein the step of combining the USB and LSB signals comprises a step of computing a product of the LSB signal and the complex conjugate of the USB signal.

24. A method as claimed in claim 22, wherein the step of computing a phase error value comprises a step of summing an imaginary part of the composite signal value over a predetermined number of occurrences.

25. A method as claimed in claim 22, further comprising a step of computing a lock indicator value.

26. A method as claimed in claim 25, wherein the step of computing a lock indicator value comprises a step of summing a real part of the composite signal value over a predetermined number of occurrences.

27. A method as claimed in claim 19 wherein the step of deriving the recovered clock signal comprises a step of tuning a voltage controlled oscillator (VCO).

28. A method as claimed in claim 27, wherein the step of tuning a voltage controlled oscillator (VCO) comprises steps of:
computing a tristate output of a pulse sequencer using the detected clock phase;
supplying the tristate output to a charge pump integrator; and
supplying an output of the charge pump integrator to a tuning port of the VCO.

29. A method as claimed in claim 28, further comprising steps of:
detecting a frequency error of the VCO output, relative to a reference clock;
adding the detected frequency error to the detected clock phase; and
supplying the addition result to the pulse sequencer.

30. A method as claimed in claim 28, further comprising steps of:
computing a tristate output of a digital phase detector based on a phase error of the VCO output, relative to a reference clock;
decoupling the tristate output of the pulse sequencer from the charge pump integrator; and
supplying the tristate output of the digital phase detector to the charge pump integrator.

31. A method as claimed in claim 1 wherein the step of deriving the recovered clock signal comprises acquiring a lock condition by deriving the clock signal in accordance with a first method and subsequently maintaining the lock condition by deriving the clock signal in accordance with a second method.

32. A method as claimed in claim 1 wherein the step of processing a stream of multi-bit digital samples of the optical signal comprises steps of:
selecting one of a plurality of functions; and
applying the selected function to the stream of multi-bit digital samples;
wherein selection of the function is at least in part in response to a polarization condition of the optical signal.

33. A method as claimed in claim 32, wherein at least one of the plurality of functions is nonlinear.

34. A method as claimed in claim 32, wherein the step of selecting one of a plurality of functions comprises selecting a function which maximizes a clock quality.

35. An apparatus for recovering a clock signal from a high speed optical signal received through an optical communications network, the comprising:
a compensator for processing a stream of multi-bit digital samples of the optical signal to generate a polarization compensated signal; and
a signal processor for deriving a recovered clock signal using the polarization compensated signal;
wherein the compensator is connected to process a portion of the multi-bit digital sample stream using an inverse Jones matrix.

36. An apparatus as claimed in claim 35, wherein the compensator and the signal processor are pipelined such that the clock signal is recovered substantially in real time with reception of the optical signal.

37. An apparatus as claimed in claim 35, wherein the compensator comprises a respective parallel compensator block for each polarization of the optical signal, each compensator block being adapted to process the multi-bit sample stream of the respective received polarization of the optical signal.

38. An apparatus as claimed in claim 37, wherein the respective multi-bit digital sample stream comprises a parallel pair of digital sample streams respectively corresponding to In-Phase and Quadrature components of the received polarization.

39. An apparatus as claimed in claim 35, wherein the portion of the multi-bit digital sample stream comprises an upper side band (USB) and a lower side band (LSB) of the multi-bit digital sample stream.

40. An apparatus as claimed in claim 39, wherein the USB and LSB are tapped from a Fast Fourier Transform (FFT) computed over the multi-bit digital sample stream.

41. An apparatus as claimed in claim 35, wherein the inverse Jones matrix is a simplified inverse Jones matrix having respective phase and angle filter coefficients for each polarization.

42. An apparatus as claimed in claim 41, further comprising an adaptation loop for computing updated filter coefficients at a predetermined adaptation rate.

43. An apparatus as claimed in claim 42 wherein the predetermined adaptation rate is on the order to 1 MHz or higher.

44. An apparatus as claimed in claim 42, wherein the adaptation loop comprises a coefficient calculator for computing respective phase and angle coefficient values, for each polarization, which optimize a phase lock indicator function.

45. An apparatus as claimed in claim 44, wherein the phase lock indicator function is $$f(\theta_p, \phi_p) = \text{Re}\left[\sum_{k=1}^{K} S_{opt}^{USB}(k) * S_{opt}^{LSB}(k)\right],$$

where $$S_{opt}^{USB}(k) \text{ and } S_{opt}^{LSB}(k)$$

are upper side band and lower side band signal portions, respectively, of the compensated signal; and wherein the coefficient calculator is adapted to compute the equations:

$$\phi_p(n+1) = \phi_p(n) + u_\phi \sum_{k=1}^{K} \Gamma f(\phi_p)$$

$$\theta_p(n+1) = \theta_p(n) + u_\theta \sum_{k=1}^{K} \Gamma f(\theta_p)$$

where:

$$u_\phi \sum_{k=1}^{K} \Gamma f(\phi_p) \text{ and } u_\theta \sum_{k=1}^{K} \Gamma f(\theta_p)$$

are summed gradient values derived from the phase lock indicator function; and $u_\phi$ and $u_\theta$ are update step sizes.

46. An apparatus as claimed in claim 44, wherein the coefficient calculator further comprises:
   means for computing a respective update increment for each filter coefficient which, when added to a current coefficient value optimizes the phase lock indicator function;
   a latch for selecting one of the update increments and sweeper increments output by a sweeper; and
   means for computing updated filter coefficients using the selected increments.

47. An apparatus as claimed in claim 46, wherein the sweeper comprises means for generating a respective sweeper increment value for each filter coefficient at a predetermined repetition rate.

48. An apparatus as claimed in claim 47, wherein the predetermined repetition rate is determined by frequency dividing a reference clock signal by a prime number divisor.

49. An apparatus as claimed in claim 47, wherein the predetermined repetition rate of one sweeper increment value is about 10 times that of another sweeper increment value.

50. An apparatus as claimed in claim 46, wherein the latch is responsive to a lock state of the apparatus.

51. An apparatus as claimed in claim 35, further comprising a dispersion compensator for compensating dispersion of the optical signal.

52. An apparatus as claimed in claim 51, wherein the dispersion compensator is coupled to an input of the compensator, such that the compensator receives a dispersion compensated sample stream.

53. An apparatus as claimed in claim 51, wherein the dispersion compensator comprises a Fast Fourier Transform (FFT) filter for computing a Fast Fourier Transform (FFT) of the digital sample stream, and for applying a dispersive function to the computed FFT.

54. An apparatus as claimed in claim 35, wherein the signal processor comprises a phase detector for detecting a clock phase using the polarization compensated signal.

55. An apparatus as claimed in claim 54, wherein the phase detector comprises:
   means for combining an upper side band (USB) and a lower side band (LSB) of the compensated signal; and
   means for computing a phase error value from the composite signal value.

56. An apparatus as claimed in claim 55, wherein the means for combining the USB and LSB of the compensated signal comprises means for computing a product of the LSB signal and the complex conjugate of the USB signal.

57. An apparatus as claimed in claim 55, wherein the means for computing a phase error value comprises a summation block for summing an imaginary part of the composite signal value over a predetermined number of occurrences.

58. An apparatus as claimed in claim 55, further means for computing a lock indicator value.

59. An apparatus as claimed in claim 58, wherein the means for computing a lock indicator value comprises a summation block for summing a real part of the composite signal value over a predetermined number of occurrences.

60. An apparatus as claimed in claim 35, wherein the signal processor comprises means for tuning a voltage controlled oscillator (VCO).

61. An apparatus as claimed in claim 60, wherein the means for tuning a voltage controlled oscillator (VCO) comprises:
   a pulse sequencer for computing a tristate output using a detected clock phase; and
   a charge pump integrator coupled to receive the tristate output of the pulse sequencer, an output of the charge pump integrator being coupled to a tuning port of the VOC.

62. An apparatus as claimed in claim 61, further comprising:
   a frequency detector for detecting a frequency error of the VCO output, relative to a reference clock;
   an adder for adding the detected frequency error to the detected clock phase, an output of the adder being coupled to an input of the pulse sequencer.

63. An apparatus as claimed in claim 61, further comprising:
   a digital phase detector for computing a tristate output based on a phase error of the VCO output, relative to a reference clock; and
   means for selectively supplying the tristate output of the digital phase detector to the charge pump integrator.

64. An apparatus as claimed in claim 61, wherein a digital integrator of the pulse sequencer is coupled to an analog integrator of the charge pump.

65. An apparatus as claimed in claim 35, further comprising a controller adapted to control at least the signal processor to acquire a lock condition by deriving the clock signal in accordance with a first method and subsequently maintain the lock condition by deriving the clock signal in accordance with a second method.

66. An apparatus as claimed in claim 35, wherein the signal processor comprises:
   means for selecting one of a plurality of functions; and
   means for applying the selected function to the stream of multi-bit digital samples;
   wherein selection of the function is at least in part in response to a polarization condition of the optical signal.

67. An apparatus as claimed in claim 66, wherein at least one of the plurality of functions is nonlinear.

68. An optical communications system comprising:
   a receiver for receiving an optical signal and generating a corresponding multi-bit digital sample stream;
   a compensator for processing the stream of multi-bit digital samples to generate a polarization compensated signal;
   a signal processor for deriving a recovered clock signal using the polarization compensated signal; and
   wherein the compensator is connected to process a portion of the multi-bit digital sample stream using an inverse Jones matrix.

* * * * *